United States Patent
Huang et al.

(10) Patent No.: US 7,535,751 B2
(45) Date of Patent: May 19, 2009

(54) DUAL-PORT SRAM DEVICE

(75) Inventors: Huai-Ying Huang, Jhonghe (TW); Forst Hung, Hsinchu (TW); Feng-Ming Chang, Chia-yi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 318 days.

(21) Appl. No.: 11/705,281

(22) Filed: Feb. 12, 2007

(65) Prior Publication Data

US 2008/0192561 A1 Aug. 14, 2008

(51) Int. Cl.
*G11C 11/00* (2006.01)
*G11C 8/00* (2006.01)

(52) U.S. Cl. .......... 365/154; 365/230.05; 257/E27.098; 257/E21.661

(58) Field of Classification Search ................ 365/154, 365/155, 156, 230.05; 257/E27.098, E21.661
See application file for complete search history.

(56) References Cited

U.S. PATENT DOCUMENTS

| | | | | | |
|---|---|---|---|---|---|
| 4,175,290 | A | * | 11/1979 | Harari | 365/185.07 |
| 4,987,090 | A | * | 1/1991 | Hsu et al. | 438/209 |
| 5,793,059 | A | * | 8/1998 | Park | 257/67 |
| 5,821,136 | A | * | 10/1998 | Chan et al. | 438/158 |
| 6,271,063 | B1 | * | 8/2001 | Chan et al. | 438/153 |

* cited by examiner

*Primary Examiner*—Ly D Pham
(74) *Attorney, Agent, or Firm*—K & L Gates LLP

(57) ABSTRACT

A dual-port SRAM cell structure includes a first inverter area where a first inverter is constructed on a semiconductor substrate; a second inverter area where a second inverter is constructed on the semiconductor substrate, the first and second inverters being cross-coupled to form one or more data stage nodes for latching a value; and a first pass gate transistor area where a first write port pass gate transistor and a first read port pass gate transistor share a first oxide defined region for balancing device performances thereof. The first write port pass gate transistor and the first read port pass gate transistor are coupled to the data storage nodes for selectively reading or writing a value therefrom or thereinto.

20 Claims, 6 Drawing Sheets

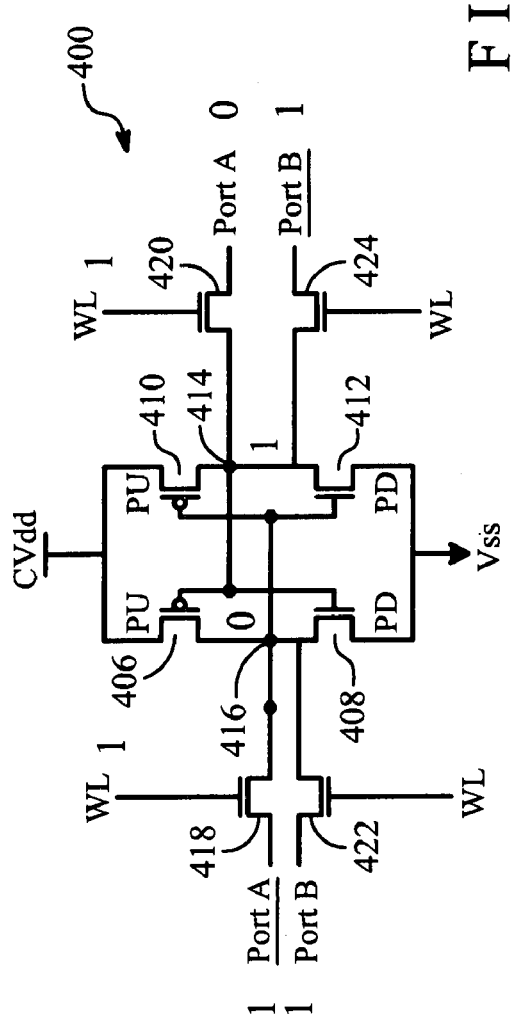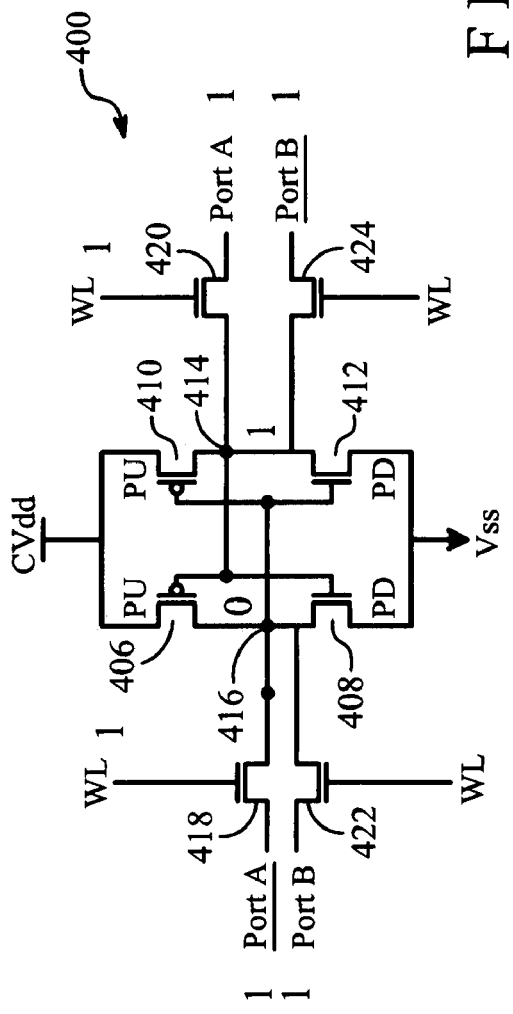
FIG. 8
FIG. 9

DUAL-PORT SRAM DEVICE

BACKGROUND

The present invention relates generally to integrated circuit (IC) designs, and more particularly to a dual-port static random access memory (SRAM) cell with balanced performance between its read ports and write ports.

FIG. 1 schematically illustrates a typical dual-port SRAM cell 100 that is often used in memory devices for electronic products, such as cellular phones, digital cameras, personal digital assistants, and personal computers. The cell 100 includes two cross-coupled inverters 102 and 104. The inverter 102 is comprised of a pull-up p-type metal-oxide-semiconductor (PMOS) transistor 106 and a pull-down n-type metal-oxide-semiconductor (NMOS) transistor 108. The inverter 104 is comprised of a pull-up PMOS transistor 110 and a pull-down NMOS transistor 112. The sources of the PMOS transistors 106 and 110 are coupled to a power supply CVdd through a power line. The sources of the NMOS transistors 108 and 112 are coupled to a ground or a complementary power supply Vss through a complementary power line. The gates of PMOS transistor 106 and NMOS transistors 108 are connected together at a node 114, which is further connected to the drains of PMOS transistor 110 and NMOS transistor 112. The gates of PMOS transistor 110 and NMOS transistor 112 are connected together at node 116, which is further connected to the drains of PMOS transistor 106 and NMOS transistor 108. The cross-coupled first and second inverters 102 and 104 function as a latch that stores a value and its complement at the nodes 114 and 116, respectively.

A first write port pass gate transistor 120 is coupled between a write bit line (not shown in this figure) and the node 114. A second write port pass gate transistor 118 is coupled between a write bit line bar (not shown in this figure) and the node 116. A first read port pass gate transistor 122 is coupled between a read port bit line (not shown in this figure) and the node 116. A second read port pass gate transistor 124 is coupled between a second port bit line bar (not shown in the figure) and the node 114. The gates of the write pass gate transistors 118 and 120 are controlled by a write port word line WLA. The gates of the read pass gate transistors 122 and 124 are controlled by a read port word line WLB.

FIG. 2 illustrates a layout diagram 200 of the dual-port SRAM cell 100 shown in FIG. 1 on the substrate level. Referring to FIG. 1 and FIG. 2 simultaneously, the write port pass gate transistors 118 and 120 share the same write word line WLA over the oxide defined areas 202 and 204, respectively. Similarly, the read port pass gate transistors 122 and 124 share the same read word line WLB over the oxide defined areas 206 and 208, respectively. As shown in the drawing, the oxide define area 202 has a different shape from the oxide define area 204. As a result, the write port pass gate transistors 202 and 204 suffer from performance imbalance. Similarly, since the oxide defined areas 206 and 208 are also different in shape, the read port pass gate transistors 122 and 124 also suffer from performance imbalance.

FIG. 3 illustrates a layout diagram 300 of the dual-port SRAM cell 100, including the substrate level and the first metallization level. Referring to FIG. 1 and FIG. 3 simultaneously, the write port pass gate transistor 118 is connected to the read port pass gate transistor 122 via an interconnection structure 302. Because the transistors 118 and 122 are placed at two sides of the layout diagram 300, the interconnection structure 302 is rather long and space consuming. As a result, the conventional layout diagram 300 is not space efficient.

Thus, what is needed is a layout design for a dual-port SRAM cell that solves the performance imbalance issue and improves the space efficiency.

SUMMARY

The present invention discloses a dual-port SRAM cell structure. In one embodiment of the invention, the cell structure, includes a first inverter area where a first inverter is constructed on a semiconductor substrate; a second inverter area where a second inverter is constructed on the semiconductor substrate, the first and second inverters being cross-coupled to form one or more data stage nodes for latching a value; and a first pass gate transistor area where a first write port pass gate transistor and a first read port pass gate transistor share a first oxide defined region for balancing device performances thereof. The first write port pass gate transistor and the first read port pass gate transistor are coupled to the data storage nodes for selectively reading or writing a value therefrom or thereinto.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 schematically illustrates a dual-port SRAM cell in write operation in accordance with one embodiment of the present invention.

FIG. 9 schematically illustrates a dual-port SRAM cell in read operation in accordance with one embodiment of the present invention.

DESCRIPTION

This invention describes a dual-port SRAM cell with improved performance balance and space efficiency. The following merely illustrates the various embodiments of the present invention for purposes of explaining the principles thereof. It is understood that those skilled in the art will be able to devise various equivalents that, although not explicitly described herein, embody the principles of this invention.

Figure 4:
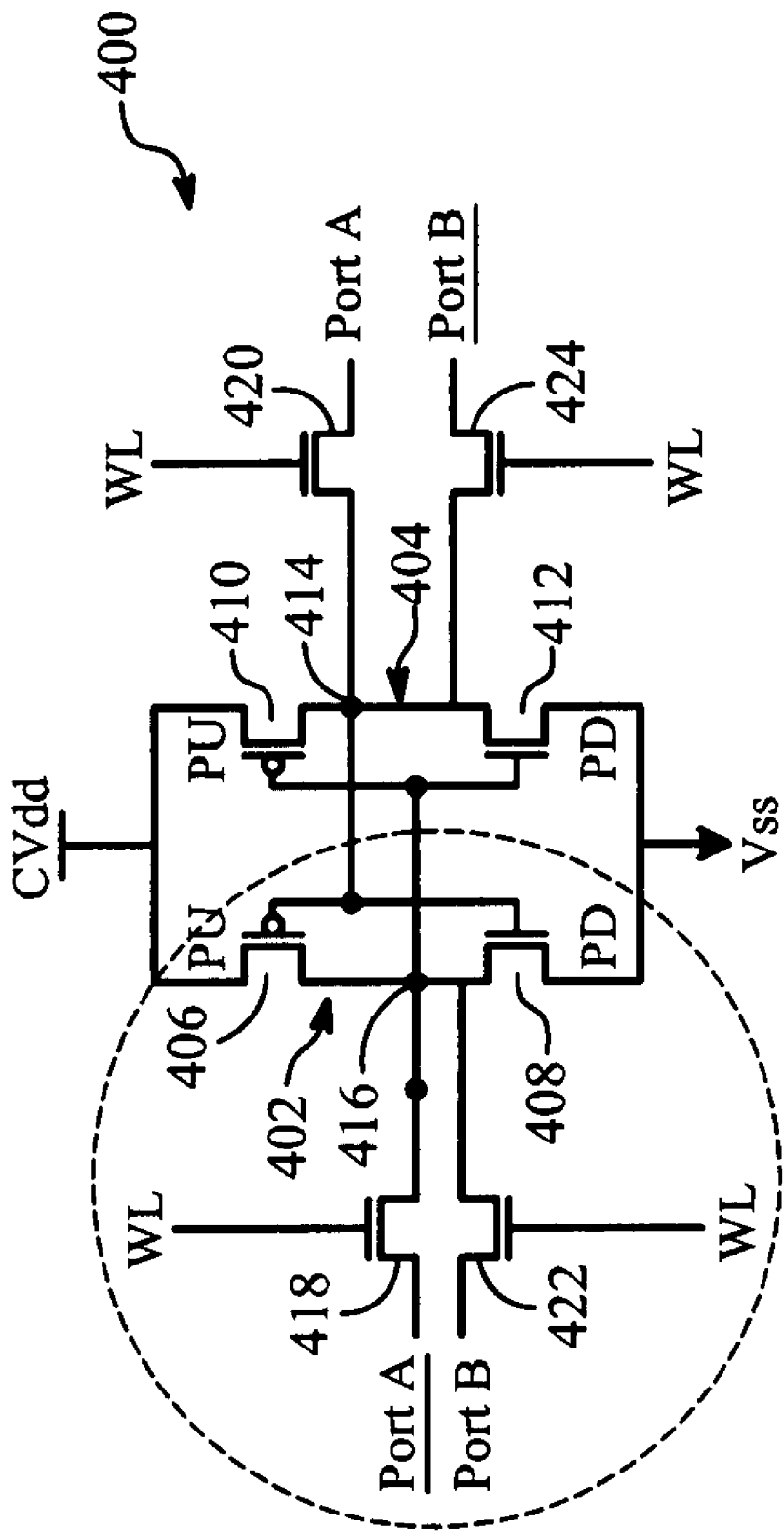
FIG. 4 schematically illustrates a dual-port SRAM cell in accordance with one embodiment of the present invention.

FIG. 4 schematically illustrates a dual-port SRAM cell 400 in accordance with one embodiment of the present invention. The cell 400 includes two cross-coupled inverters 402 and 404. The inverter 402 is comprised of a pull-up PMOS transistor 406 and a pull-down NMOS transistor 408. The inverter 404 is comprised of a pull-up PMOS transistor 410 and a pull-down NMOS transistor 412. The sources of the PMOS transistors 406 and 410 are coupled to a power supply CVdd through a power line. The sources of the NMOS transistors 408 and 412 are coupled to a ground or a complementary power supply Vss through a complementary power line. The gates of PMOS transistor 406 and NMOS transistors 408 are connected together at a node 414, which is further connected to the drains of PMOS transistor 410 and NMOS transistor 412. The gates of PMOS transistor 410 and NMOS transistor 412 are connected together at node 416, which is further connected to the drains of PMOS transistor 406 and NMOS transistor 408. The cross-coupled first and second inverters 402 and 404 function as a latch that stores a value and its complement at the nodes 414 and 416, respectively.

A first write port pass gate transistor 420 is coupled between a write bit line (not shown in this figure) and the node 414. A second write port pass gate transistor 418 is coupled between a write bit line bar (not shown in this figure) and the node 416. A first read port pass gate transistor 422 is coupled between a read port bit line (not shown in this figure) and the node 416. A second read port pass gate transistor 424 is coupled between a second port bit line bar (not shown in the figure) and the node 414. The gates of pass gate transistors 418, 420, 422 and 424 are controlled by the same word line WL.

Figure 5:
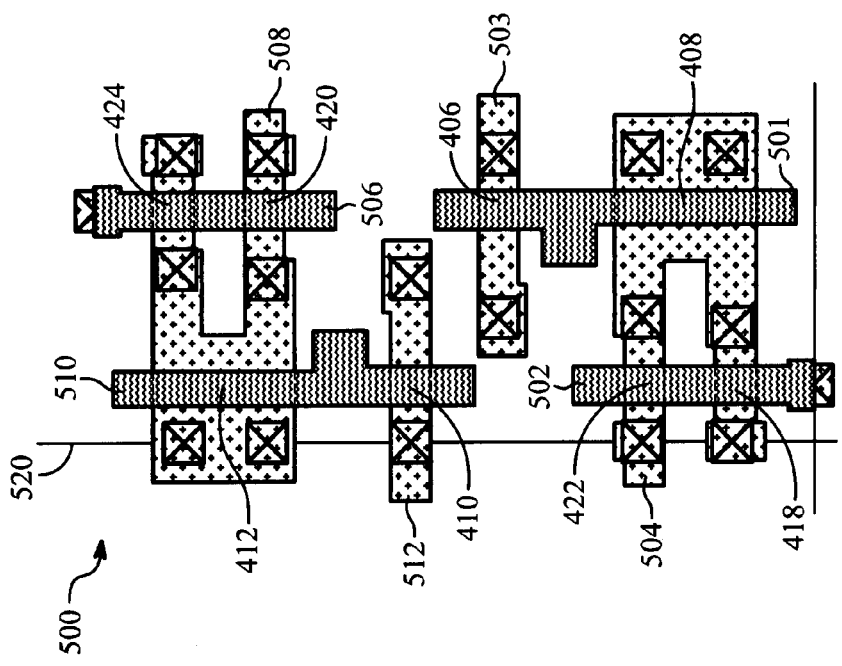
FIG. 5 illustrates a layout diagram of the proposed dual-port SRAM cell on the substrate level in accordance with one embodiment of the present invention.

FIG. 5 illustrates a layout diagram 500 of the proposed dual-port SRAM cell on the substrate level in accordance with one embodiment of the present invention. Referring to FIG. 4 and FIG. 5 simultaneously, the write port pass gate transistors 418 and the read port pass gate transistor 422 share the same gate conductive line 502 over an oxide defined area 504. A gate conductive line 501 is disposed over the oxide defined area 504 and 503, and defines the pull-down NMOS transistor 408 and the pull-up PMOS transistor 406, respectively. Similarly, the write port pass gate transistors 420 and the read port pass gate transistor 424 share the same gate conductive line 506 over an oxide defined area 508. A gate conductive line 510 is disposed over the oxide defined area 508 and 512, and defines the pull-down NMOS transistor 412 and the pull-up PMOS transistor 410, respectively.

The area where the PMOS transistor 406 and the NMOS transistor 408 are constructed is referred to as a first inverter area, and the area where the PMOS transistor 412 and the NMOS transistor 410 are constructed is referred to as a second inverter area. The area where the write port pass gate transistor 420 and the read port pass gate transistor 424 are constructed is referred to as the first pass gate transistor area, and the area where the write port pass gate transistor 418 and the read port pass gate transistor 422 are constructed is referred to as the second pass gate transistor area. The first inverter area and the first pass gate transistor area are substantially in alignment with a layout boundary 520 of the dual-port SRAM cell. Similarly, the second inverter area and the second pass gate transistor area are also substantially in alignment with a layout boundary 520 of the dual-port SRAM cell.

As shown in the drawing that the write port pass gate transistor 418/420 and the read port pass gate transistor 422/424 share the same oxide defined area 504/508, over which the pull-down transistors 408/412 are also constructed, the performance imbalance therebetween can therefore be reduced or eliminated.

Figure 1:
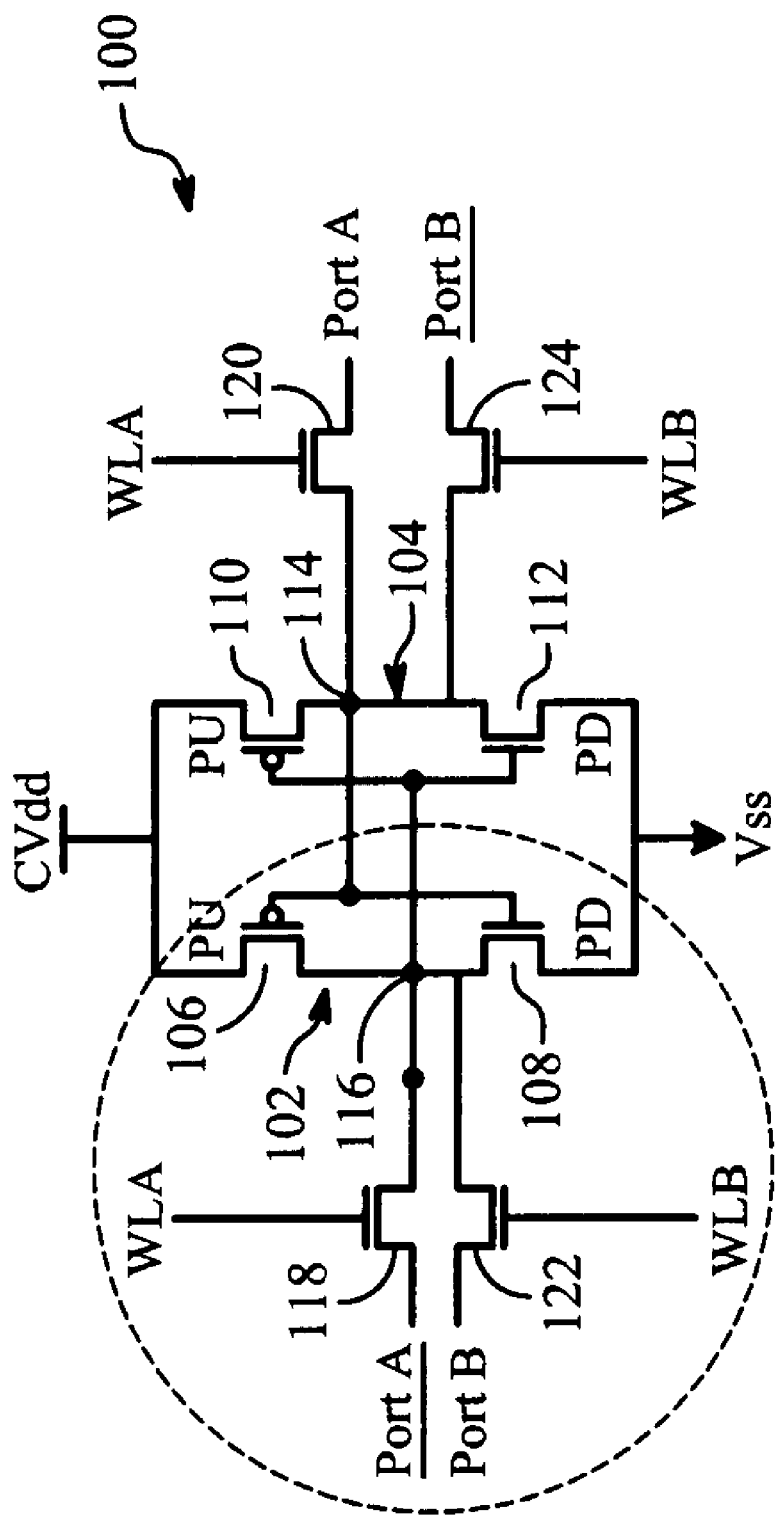
FIG. 1 schematically illustrates a conventional dual-port SRAM cell.
Figure 3:
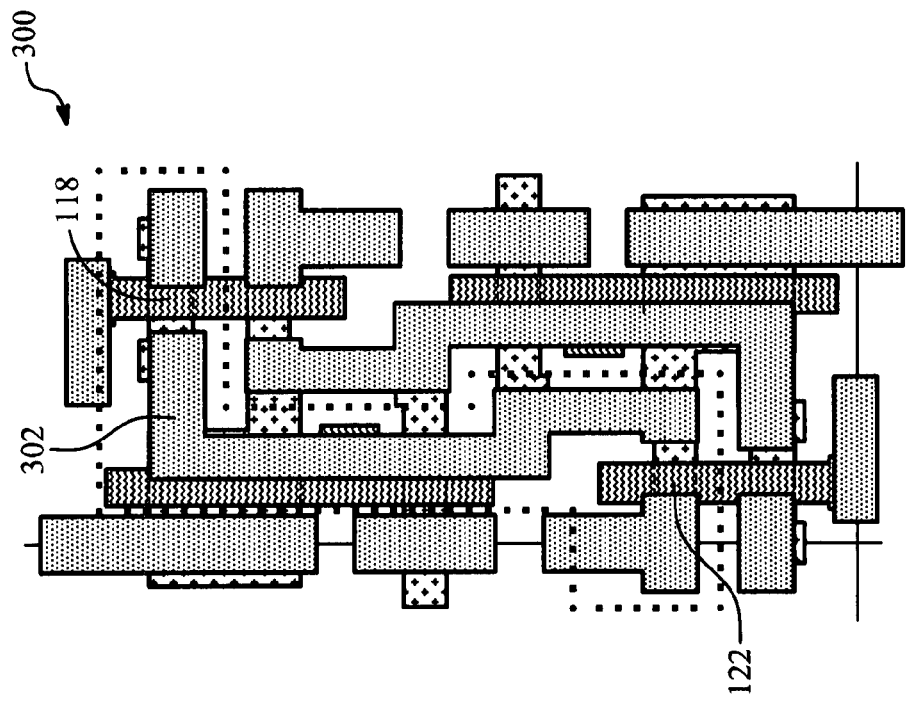
FIG. 3 schematically illustrates a layout diagram of the conventional dual-port SRAM cell, including the substrate level and the first metallization level.
Figure 2:
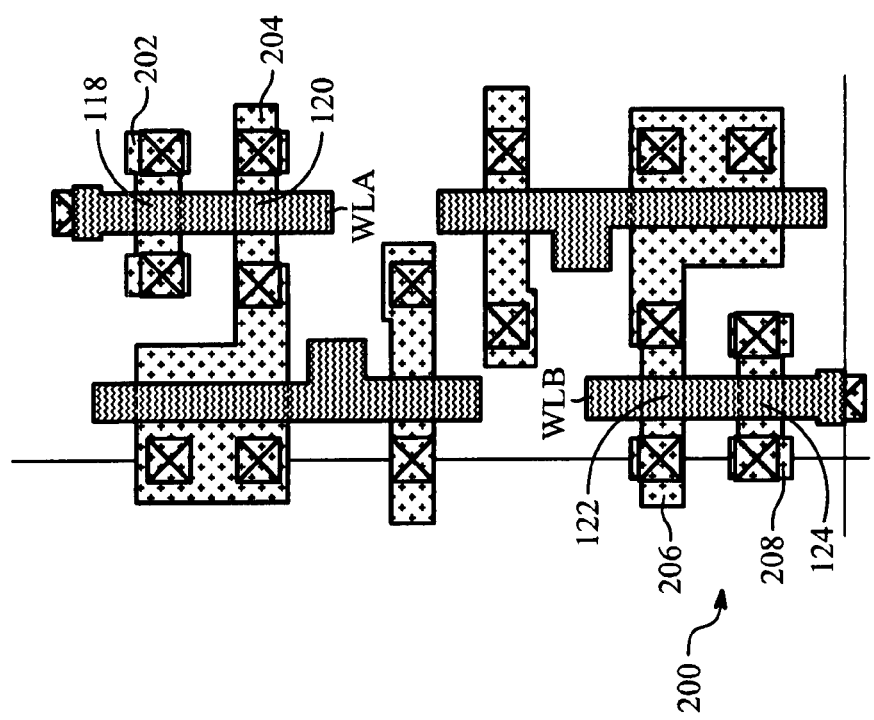
FIG. 2 schematically illustrates a layout diagram of the conventional dual-port SRAM cell on the substrate level.
Figure 6:
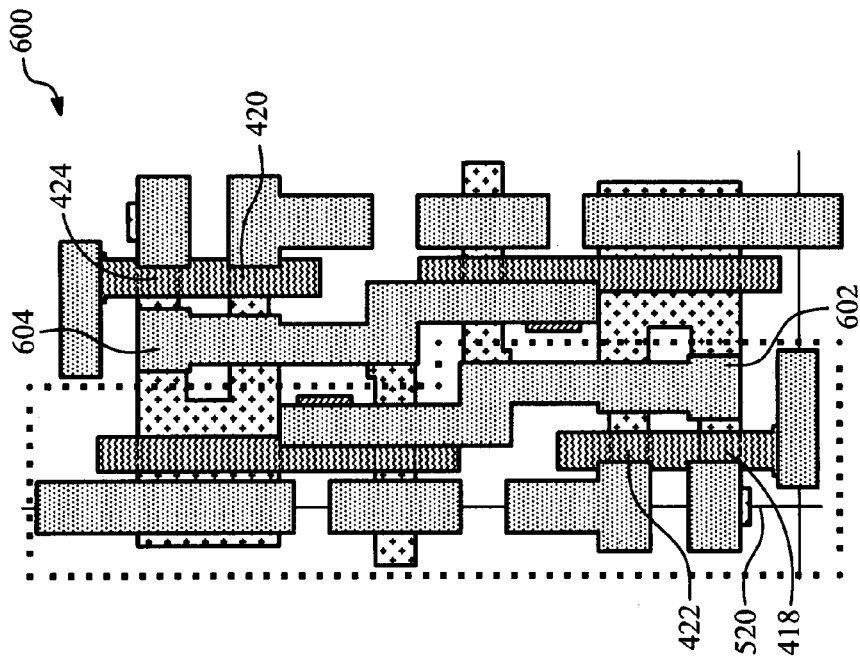
FIG. 6 illustrates a layout diagram of the proposed dual-port SRAM cell, including the substrate level and the first metallization level, in accordance with one embodiment of the present invention.

FIG. 6 illustrates a layout diagram 600 of the proposed dual-port SRAM cell, including the substrate level and the first metallization level, in accordance with one embodiment of the present invention. Referring to FIG. 4 and FIG. 6 simultaneously, the write port pass gate transistor 418 is connected to the read port pass gate transistor 422 via an interconnection structure 602, which is much shorter than its conventional counterpart 302 shown in FIG. 3. For example, the conductive line 602 is shorter than 80 percent of a longitudinal side of a layout boundary 502 of the dual-port SRAM cell. Similarly, the write port pass gate transistor 420 is connected to the read port pass gate transistor 424 via an interconnection structure 604, which is also much shorter than its conventional counterpart. For example, the conductive line 604 is also shorter than 80 percent of a longitudinal side of a layout boundary 502 of the dual-port SRAM cell. As such, the proposed layout design for the dual-port SRAM cell can improve the space efficiency.

Figure 7:
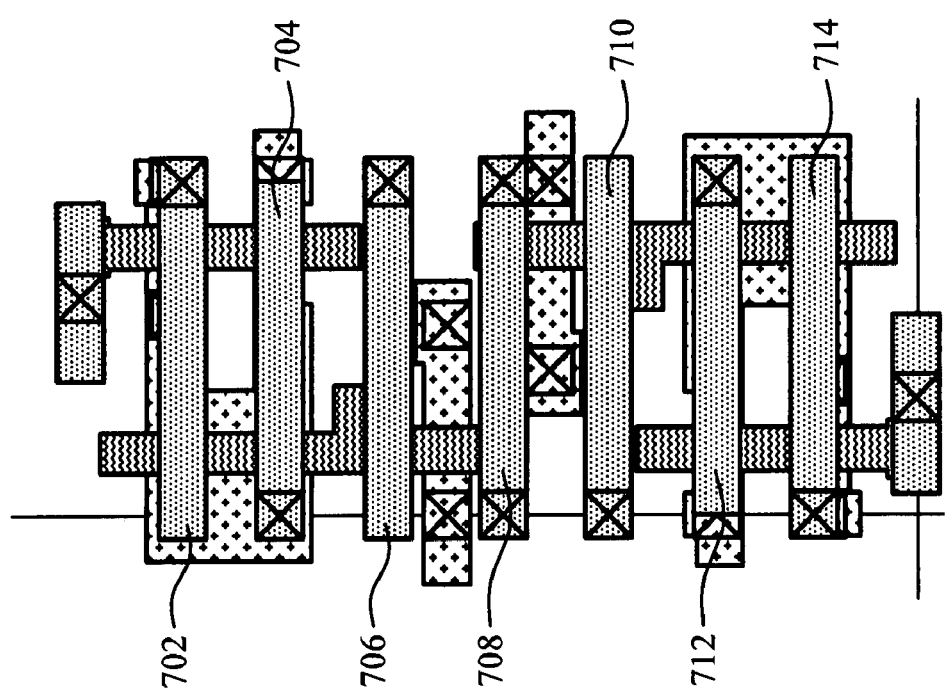
FIG. 7 illustrates a layout diagram of the proposed dual-port SRAM cell, including the substrate level, the first metallization level and the second metallization level, in accordance with one embodiment of the present invention.

FIG. 7 illustrates a layout diagram of the proposed dual-port SRAM cell, including the substrate level, the first metallization level and the second metallization level, in accordance with one embodiment of the present invention. The layout diagram includes a bit line 702, a complementary power line 704, a bit line 706, a power line 708, a bit line 710, a complementary power line 712 and a bit line 714. As shown in the drawing, every two neighboring bit lines are separated by a power line or a complementary power line. As a result, the electromagnetic interference between two neighboring bit lines can be reduced or eliminated.

FIG. 8 schematically illustrates the dual-port SRAM cell 400 in write operation in accordance with one embodiment of the present invention. During write operation, the word line WL is asserted to turn on pass gate transistors 418, 420, 422 and 424. The voltages at the drain of the transistors 418, 422 and 424 are raised to a high level, while the voltage at the drain of the transistor 420 remains at a low level. Since the signals at the drains of the read port pass gate transistors 422 and 424 will not affect the write operation, the low voltage at the drain of the transistor 420 will turn on the pull-up PMOS transistor 406, thereby charging the node 416 to high. This, in turn, switches on the pull-down NMOS transistor 412, thereby pulling the voltage at the node 414 low to the complementary voltage Vss. As such, a value is latched in the cell 400.

FIG. 9 schematically illustrates the dual-port SRAM cell 400 in read operation in accordance with one embodiment of the present invention. During read operation, the word line WL is asserted to turn on pass gate transistors 418, 420, 422 and 424. The voltages at the drains of the transistors 418, 420, 422 and 424 are all raised to a high level. Since the signals at the drains of the write port pass gate transistors 418 and 420 will not affect the read operation, the low voltage at the 416 will pull the signal at the drain of the transistor 418 low to the complementary voltage Vss. As such, the logic state latched by the cell 400 can be read accordingly.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A dual-port static random access memory (SRAM) cell structure, comprising:
   a first inverter area where a first inverter is constructed on a semiconductor substrate;
   a second inverter area where a second inverter is constructed on the semiconductor substrate, the first and second inverters being cross-coupled to form one or more data stage nodes for latching a value; and
   a first pass gate transistor area where a first write port pass gate transistor and a first read port pass gate transistor share a first oxide defined region for balancing device performances thereof,
   wherein the first write port pass gate transistor and the first read port pass gate transistor are coupled to the data storage nodes for selectively reading or writing a value therefrom or thereinto.

2. The dual-port SRAM cell structure of claim 1 further comprising a second pass gate transistor area where a second write port pass gate transistor and a second read port pass gate transistor share a second oxide defined region for balancing device performances thereof.

3. The dual-port SRAM cell structure of claim 1 wherein the first inverter area comprises a first pull-down transistor sharing the first oxide defined region with the first read port pass gate transistor and the first write port pass gate transistor.

4. The dual-port SRAM cell structure of claim 1 wherein the second inverter area comprises a second pull-down transistor sharing the second oxide defined region with the second read port pass gate transistor and the second write port pass gate transistor.

5. The dual-port SRAM cell structure of claim 1 wherein the first write port pass gate transistor and the first read port pass gate transistor are connected together to a first gate conductive line.

6. The dual-port SRAM cell structure of claim 1 wherein the second write port pass gate transistor and the second read port pass gate transistor are connected together to a second gate conductive line.

7. The dual-port SRAM cell structure of claim 1 wherein the first inverter area and the first pass gate transistor area are substantially in alignment with a layout boundary of the dual-port SRAM cell.

8. The dual-port SRAM cell structure of claim 1 wherein the second inverter area and the second pass gate transistor area are substantially in alignment with a layout boundary of the dual-port SRAM cell.

9. The dual-port SRAM cell structure of claim 1 further comprising a first conductive line on a first metallization level for connecting sources of the first write port pass gate transistor and the first read port pass gate transistor, wherein the first conductive line is shorter than 80 percent of a longitudinal side of a layout boundary of the dual-port SRAM cell.

10. The dual-port SRAM cell structure of claim 1 further comprising a second conductive line on a first metallization level for connecting sources of the second write port pass gate transistor and the second read port pass gate transistor, wherein the second conductive line is shorter than 80 percent of a longitudinal side of a layout boundary of the dual-port SRAM cell.

11. The dual-port SRAM cell structure of claim 1 further comprising one or more bit lines separated by a power supply line or a complementary power supply line on a second metallization level.

12. A dual-port static random access memory (SRAM) cell structure, comprising:
   a first inverter area where a first inverter is constructed on a semiconductor substrate;
   a second inverter area where a second inverter is constructed on the semiconductor substrate, the first and second inverters being cross-coupled to form one or more data stage nodes for latching a value;
   a first pass gate transistor area where a first write port pass gate transistor and a first read port pass gate transistor share a first oxide defined region for balancing device performances thereof; and
   a second pass gate transistor area where a second write port pass gate transistor and a second read port pass gate transistor share a second oxide defined region for balancing device performances thereof,
   wherein the first write port pass gate transistor, the first read port pass gate transistor, the second write port gate transistor and the second read port pass gate transistor are coupled to the data storage nodes for selectively reading or writing a value therefrom or thereinto.

13. The dual-port SRAM cell structure of claim 12 wherein the first inverter comprises a first pull-up transistor having a source coupled to the supply voltage, a drain coupled to the second write port pass gate transistor and the first read port pass gate transistor, and a gate.

14. The dual-port SRAM cell structure of claim 13 wherein the first inverter comprises a first pull-down transistor having a drain coupled to the drain of the first pull-up transistor, a source coupled to the complementary supply voltage, and a gate coupled to the gate of the first pull-up transistor.

15. The dual-port SRAM cell structure of claim 14 wherein the first pull-down transistor shares the first oxide defined region with the first read port pass gate transistor and the first write port pass gate transistor.

16. The dual-port SRAM cell structure of claim 12 wherein the second inverter comprises a second pull-up transistor having a source coupled to the supply voltage, a drain coupled to the gates of the first pull-up and pull-down transistors as well as to the first write port pass gate transistor and the second read port pass gate transistor, and a gate.

17. The dual-port SRAM cell structure of claim 16 wherein the second inverter comprises a second pull-down transistor having a drain coupled to the drain of the second pull-up transistor, a source coupled to the complementary supply voltage, and a gate coupled to the gate of the second pull-up transistor.

18. The dual-port SRAM cell structure of claim 17 wherein the second pull-down transistor shares the second oxide defined region with the second read port pass gate transistor and the second write port pass gate transistor.

19. The dual-port SRAM cell structure of claim 12 wherein the first write port pass gate transistor and the first read port pass gate transistor are connected together to a first gate conductive line.

20. The dual-port SRAM cell structure of claim 12 wherein the second write port pass gate transistor and the second read port pass gate transistor are connected together to a second gate conductive line.

* * * * *